(12) United States Patent  
Nishide et al.

(10) Patent No.: US 9,702,039 B2  
(45) Date of Patent: Jul. 11, 2017

(54) GRAPHENE FORMING METHOD

(71) Applicant: TOKYO ELECTRON LIMITED, Tokyo (JP)

(72) Inventors: Daisuke Nishide, Nirasaki (JP); Takashi Matsumoto, Nirasaki (JP); Munehito Kagaya, Nirasaki (JP); Ryota Ifuku, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/819,038

(22) Filed: Aug. 5, 2015

(65) Prior Publication Data

US 2016/0042958 A1 Feb. 11, 2016

(30) Foreign Application Priority Data

Aug. 11, 2014 (JP) .................................. 2014-163785

(51) Int. Cl.
*C23C 16/18* (2006.01)
*C23C 16/26* (2006.01)
(Continued)

(52) U.S. Cl.
CPC .......... *C23C 16/26* (2013.01); *C01B 31/0453* (2013.01); *C23C 16/0218* (2013.01);
(Continued)

(58) Field of Classification Search
CPC ................................. C23C 16/18; C23C 16/26
See application file for complete search history.

(56) References Cited

U.S. PATENT DOCUMENTS 5,658,815 A * 8/1997 Lee .................... H01L 21/28105
257/E21.196
6,491,978 B1 * 12/2002 Kalyanam ............... C23C 16/18
257/E21.17
(Continued)

FOREIGN PATENT DOCUMENTS

JP 2006-299407 A 11/2006
JP 2010056393 A 3/2010
(Continued)

OTHER PUBLICATIONS

Niu, Tianchao, et al., "Growth Intermediates for CVD Graphene on Cu(111): Carbon Clusters and Defective Graphene". Journal of the American Chemical Society, 2013, 135, 8409-8414.*
(Continued)

*Primary Examiner* — Bret Chen
(74) *Attorney, Agent, or Firm* — Nath, Goldberg & Meyer; Jerald L. Meyer (57) ABSTRACT

A method for forming a base film of a graphene includes: forming a metal film as a base film of a graphene on a substrate by chemical vapor deposition (CVD) of an organic metal compound using a hydrogen gas and an ammonia gas; heating the substrate to a temperature at which impurities included in the formed metal film are eliminated as a gas; and heating the substrate to a temperature at which crystal grains of metal are grown in the metal film, wherein the temperature of the substrate in the heating the substrate to a temperature at which crystal grains of metal are grown in the metal film is higher than the temperature of the substrate in the heating the substrate to a temperature at which impurities included in the formed metal film are eliminated as a gas.

4 Claims, 8 Drawing Sheets

(51) Int. Cl.

| | |
|---|---|
| C23C 16/46 | (2006.01) |
| C23C 16/455 | (2006.01) |
| H01L 21/687 | (2006.01) |
| C23C 16/02 | (2006.01) |
| C23C 16/56 | (2006.01) |
| H01L 21/285 | (2006.01) |
| H01L 23/532 | (2006.01) |
| H01L 21/768 | (2006.01) |
| C01B 31/04 | (2006.01) |
| H01L 21/67 | (2006.01) |

(52) U.S. Cl.
CPC .......... *C23C 16/0281* (2013.01); *C23C 16/18* (2013.01); *C23C 16/45523* (2013.01); *C23C 16/46* (2013.01); *C23C 16/56* (2013.01); *H01L 21/28556* (2013.01); *H01L 21/68742* (2013.01); *H01L 21/76864* (2013.01); *H01L 21/76876* (2013.01); *H01L 23/53276* (2013.01); *H01L 21/67103* (2013.01); *H01L 2924/0002* (2013.01)

(56) References Cited

U.S. PATENT DOCUMENTS

| | | | |
|---|---|---|---|
| 8,753,468 B2 * | 6/2014 | Caldwell | B82Y 30/00 |
| | | | 156/235 |
| 9,206,509 B2 * | 12/2015 | Baraton | C23C 16/0281 |
| 2004/0171253 A1 * | 9/2004 | Kainosho | C30B 29/403 |
| | | | 438/689 |
| 2011/0198313 A1 * | 8/2011 | Baraton | C23C 16/0281 |
| | | | 216/13 |
| 2012/0138903 A1 * | 6/2012 | Chung | B82Y 30/00 |
| | | | 257/29 |
| 2013/0334579 A1 * | 12/2013 | Accardi | G01N 27/414 |
| | | | 257/253 |
| 2016/0305024 A1 * | 10/2016 | Lee | C23C 16/34 |

FOREIGN PATENT DOCUMENTS

| | | |
|---|---|---|
| JP | 2012204655 A | 10/2012 |
| JP | 2012-229488 A | 11/2012 |
| JP | 2013074034 A | 4/2013 |
| JP | 2013100205 A | 5/2013 |
| JP | 2013209701 A | 10/2013 |
| WO | 2013051670 A1 | 4/2013 |

OTHER PUBLICATIONS

Cazzanelli, E., et al., "Spectroscopic characterization of graphene films grown on Pt (111) surface by chemical vapor deposition of ethylene". Journal of Raman Spectroscopy, 2013, pp. 1-18.*

Coraux, Johann, "Graphene preparation on metals". Neel Institut, Universite Joseph Fourier, pp. 1-80. No date available.*

Naeemi, Azad, et al., "Conductance Modeling for Graphene Nanoribbon (GNR) Interconnects", IEEE Electron Device Letters, vol. 28, No. 5, pp. 428-431, May 2007.

* cited by examiner

GRAPHENE FORMING METHOD

CROSS-REFERENCE TO RELATED APPLICATION

This application claims the benefit of Japanese Patent Application No. 2014-163785, filed on Aug. 11, 2014, in the Japan Patent Office, the disclosure of which is incorporated herein in its entirety by reference.

TECHNICAL FIELD

The present disclosure relates to a method for forming a base film of a graphene, a graphene forming method, and an apparatus for forming a base film of graphene.

BACKGROUND

In a related art semiconductor device or the like, a metal, e.g., copper (Cu), is used as a material of a line, but in a micro-line structure formed with a metal line material such as Cu, conduction electrons are intensely affected by inelastic scattering in an interface due to a wire effect, resulting in a problem that a line has a high resistance.

Meanwhile, a nano-carbon material, which is different from the metal, e.g., a graphene has an extremely long mean free path and a high mobility, and when applied to the micro-line structure, the nano-carbon material may also have feasibility of a low resistance line exceeding Cu. Thus, in next-generation semiconductor devices required to realize a finer stacked structure or line structure, the use of the nano-carbon material, instead of Cu, as a material of a line is considered.

The graphene is formed using a catalytic metal layer formed on a surface of a substrate as a base film. Specifically, after a nickel (Ni) film that forms a catalytic metal layer is activated, carbon atoms decomposed from a raw material gas are solved into the activated nickel film, and the carbon atoms are recrystallized to form the graphene. Thus, the quality of the nickel film significantly affects the quality of the graphene.

In order to form a high quality nickel film, for example, a nickel film with a small amount of impurities included therein, it is proposed to use an ammonia ($NH_3$) gas, as well as a hydrogen ($H_2$) gas, as a reduction gas in forming a nickel film by a chemical vapor deposition (CVD) using an organic metal compound which contains a nickel.

However, in addition to the quality of the nickel film, a surface state, in particular, smoothness of the nickel film, also significantly affects the quality of the formed graphene. In this respect, however, in the CVD, a state in which a plurality of small-diameter particles of the nickel are deposited on the nickel film, i.e., a so-called as-deposited state, is maintained to impair the smoothness of the formed nickel film, and thus, the quality of graphene formed by using the corresponding nickel film is not high.

SUMMARY

Some embodiments of the present disclosure provide a method for forming a base film of graphene, a graphene forming method, and an apparatus for forming a base film of a graphene, which are capable of forming a high quality graphene.

According to one embodiment of the present disclosure, there is provided a method for forming a base film of a graphene, including: forming a metal film as a base film of a graphene on a substrate by chemical vapor deposition (CVD) of an organic metal compound using a hydrogen gas and an ammonia gas; heating the substrate to a temperature at which impurities included in the formed metal film are eliminated as a gas; and heating the substrate to a temperature at which crystal grains of metal are grown in the metal film, wherein the temperature of the substrate in the heating the substrate to a temperature at which crystal grains of metal are grown in the metal film is higher than the temperature of the substrate in the heating the substrate to a temperature at which impurities included in the formed metal film are eliminated as a gas.

According to one embodiment of the present disclosure, there is provided a graphene forming method, including: forming a metal film as a base film of a graphene on a substrate; and forming the graphene on the metal film, wherein the forming a metal film includes: forming the metal film on the substrate by CVD of an organic metal compound using a hydrogen gas and an ammonia gas; heating the substrate to a temperature at which impurities included in the formed metal film are eliminated as a gas; and heating the substrate to a temperature at which crystal grains of metal are grown in the metal film, wherein the temperature of the substrate in the heating the substrate to a temperature at which crystal grains of metal are grown in the metal film is higher than the temperature of the substrate in the heating the substrate to a temperature at which impurities included in the formed metal film are eliminated as a gas.

According to one embodiment of the present disclosure, there is provided an apparatus for forming a base film of a graphene, including: a CVD module configured to form a metal film as a base film of a graphene on a substrate by CVD of an organic metal compound using a hydrogen gas and an ammonia gas; a first heating module configured to heat the substrate to a temperature at which impurities included in the formed metal film are eliminated as a gas; and a second heating module configured to heat the substrate to a temperature at which crystal grains of metal are grown in the metal film, wherein the temperature of the substrate heated in the second heating module is higher than the temperature of the substrate heated in the first heating module.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 4A to 4F are views for describing an influence of a heat treatment on smoothness of a nickel film formed by a metal-organic chemical vapor deposition (MOCVD)

FIGS. 5A to 5C are views for describing an influence of a flow ratio of each gas of the MOCVD on smoothness of a nickel film.

FIGS. 8A and 8B are graphs illustrating a Raman spectrum obtained from a surface of graphene formed by using a nickel film obtained by repeating steps S61 to S63 of FIG. 6 three times.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, a graphene forming method according to a first embodiment of the present disclosure will be described.

Figure 1:
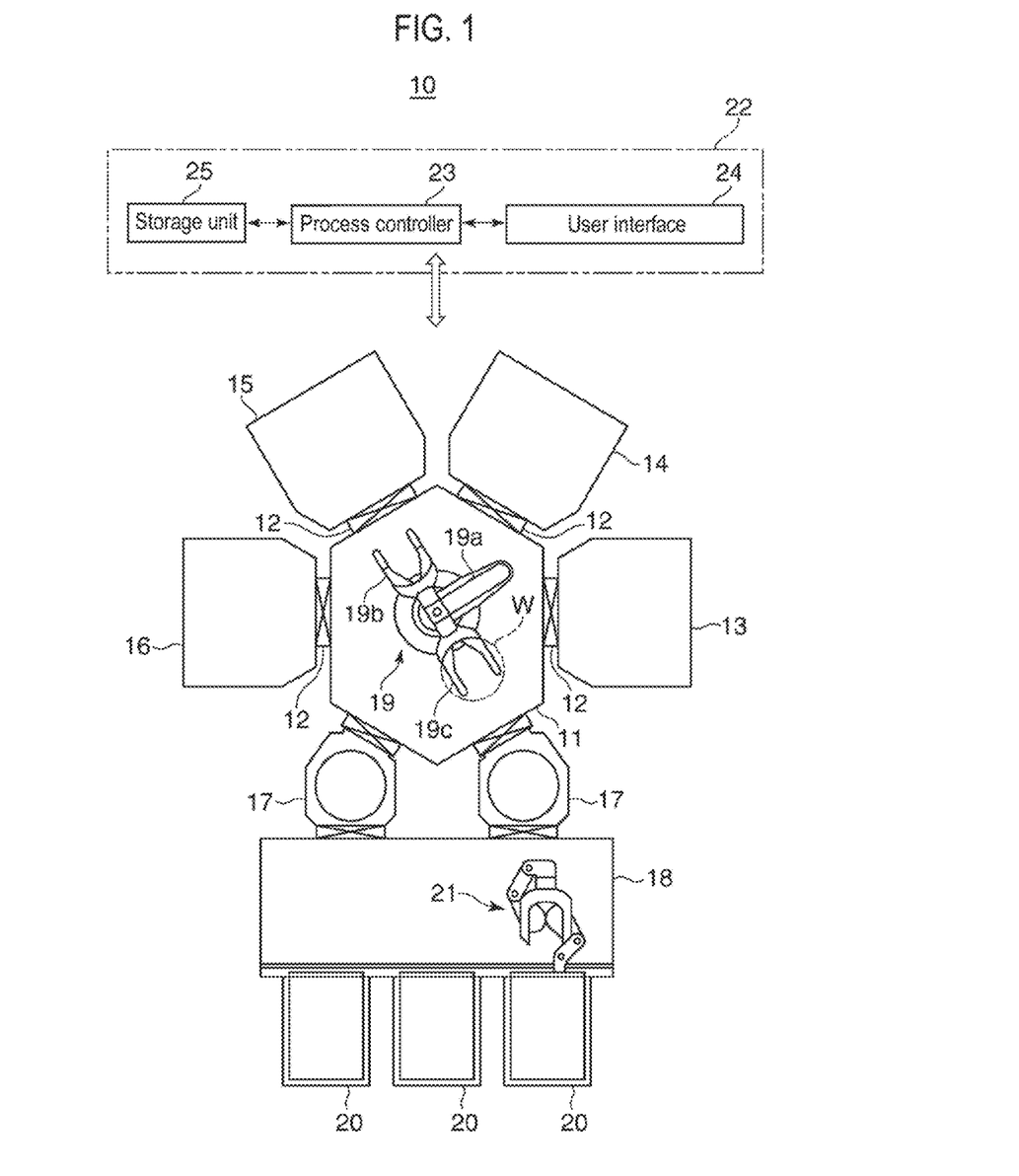
FIG. 1 is a plane view schematically illustrating a configuration of a substrate processing system used in a graphene forming method according to a first embodiment of the present disclosure.

FIG. 1 is a plane view schematically illustrating a configuration of a substrate processing system used in the graphene forming method according to the present embodiment. In FIG. 1, the substrate processing system is illustrated so that the internal components can be seen through the top of the system for convenience of description.

In FIG. 1, the substrate processing system 10 includes a decompression transfer module 11 which has a substantially hexagonal shape when seen in the plane view, a base film formation module 13 (CVD module) which is radially disposed around the decompression transfer module 11 and is connected to the decompression transfer module 11 through a gate valve 12, a first heat treatment module 14 (a first heating module), a second heat treatment module 15 (a second heating module), a graphene formation module 16, two load lock modules 17 connected to sides of the decompression transfer module 11 which are not connected to the base film formation module 13, the first heat treatment module 14, the second heat treatment module 15 and the graphene formation module 16, and a loader module 18 which faces the decompression transfer module 11 with the two load lock modules 17 interposed therbetween and is connected to the load lock modules 17. The substrate processing system 10 forms a graphene 51 (to be described later) as a wiring film on a semiconductor wafer (hereinafter, simply referred to as "wafer") formed of a silicon substrate.

The decompression transfer module 11 includes a transfer mechanism 19 having a SCARA arm structure. The transfer mechanism 19 transfers the wafer W among the base film formation module 13, the first heat treatment module 14, the second heat treatment module 15, the graphene formation module 16 and the load lock modules 17. The interior of the decompression transfer module 11 is decompressed to a predetermined vacuum degree. The transfer mechanism 19 includes a rotation and expansion/contraction portion 19a which is installed in a substantially center of the decompression transfer module 11 and is capable of a rotation and expansion/contraction, and two support arms 19b and 19c which support the wafer W installed in a front end of the rotation and expansion/contraction portion 19a. The two support arms 19b and 19c are installed in the rotation and expansion/contraction portion 19a such that the two support arms 19b and 19c face in mutually opposite directions.

Like the decompression transfer module 11, the interior of each of the base film formation module 13, the first heat treatment module 14, the second heat treatment module 15 and the graphene formation module 16 is decompressed to a predetermined degree of vacuum. The base film formation module 13 forms a nickel film 50 as a base film (to be described later) on the wafer W by MOCVD. The first heat treatment module 14 and the second heat treatment module 15 perform a heat treatment on the nickel film 50 on the wafer W by a heater (not shown) or the like. The graphene formation module 16 forms the graphene 51 on the nickel film 50 by a thermal CVD.

The loader module 18 includes a transfer robot 21 having an articulated arm structure. The transfer robot 21 transfers the wafer W between carriers 20, which accommodate a plurality of wafers W, and the load lock modules 17. The interior of the loader module 18 is maintained at atmospheric pressure.

The interior of the load lock modules 17 is switchable between an atmospheric pressure environment and a decompression environment. For example, when the wafer W is transferred between the load lock modules 17 and the transfer robot 21 of the loader module 18, the interiors of the load lock modules 17 are switched to the atmospheric environment, and thus, the load lock modules 17 are communicated with the interior of the loader module 18. Further, when the wafer W is transferred between the load lock modules 17 the transfer mechanism 19 of the decompression transfer module 11, the interiors of the load lock modules 17 are switched to the decompression environment, and thus the load lock modules 17 are communicated with the interior of the decompression transfer module 11. That is, the interiors of the load lock modules 17 are switched to the atmospheric pressure environment or the decompression, and thus the load lock modules 17 transfer the wafer W between the decompression transfer module 11 and the loader module 18.

Further, in this embodiment, the base film formation module 13, the first heat treatment module 14, the second heat treatment module 15, and the graphene formation module 16 are incorporated in the single substrate processing system 10. However, unless the nickel film 50 formed during the transfer of the wafer W is modified (e.g., oxidized) among the respective modules, all the modules may not need to be incorporated in the single substrate processing system 10.

In addition, the substrate processing system 10 further includes a control unit 22 for controlling the operation of each of the components. The control unit 22 controls the operation of each of the components of the substrate processing system 10, for example, the base film formation module 13, the graphene formation module 16 and the transfer mechanism 19. The control unit 22 has a process controller 23 having a microprocessor (computer), a user interface 24 and a storage unit 25.

The user interface 24 has a keyboard or a touch panel for inputting a command or the like for a user to operate the base film formation module 13 or the like, and a display for visually displaying an operation situation of the base film formation module 13 or the like. Further, the storage unit 25 stores a recipe including a control program (software), processing condition data, or the like for realizing various processes executed in the base film formation module 13 or the like under the control of the process controller 23.

The control unit 22 retrieves a certain recipe from the storage unit 25 according to an instruction or the like from the user interface 24, and executes the retrieved recipe in the process controller 23. At this time, a desired process, for example, a wiring formation process of FIG. 6 (to be described later) is executed in, for example, the base film formation module 13 or the like.

Further, the recipe including the control program, the processing condition data or the like may be a recipe stored in an external computer-readable recording medium (not shown). For example, a CD-ROM, a hard disk, a flexible disk, or a flash memory can be used as the recording medium. Additionally, a recipe, which is transmitted from another device through a dedicated line or the like, may be used.

Figure 2:
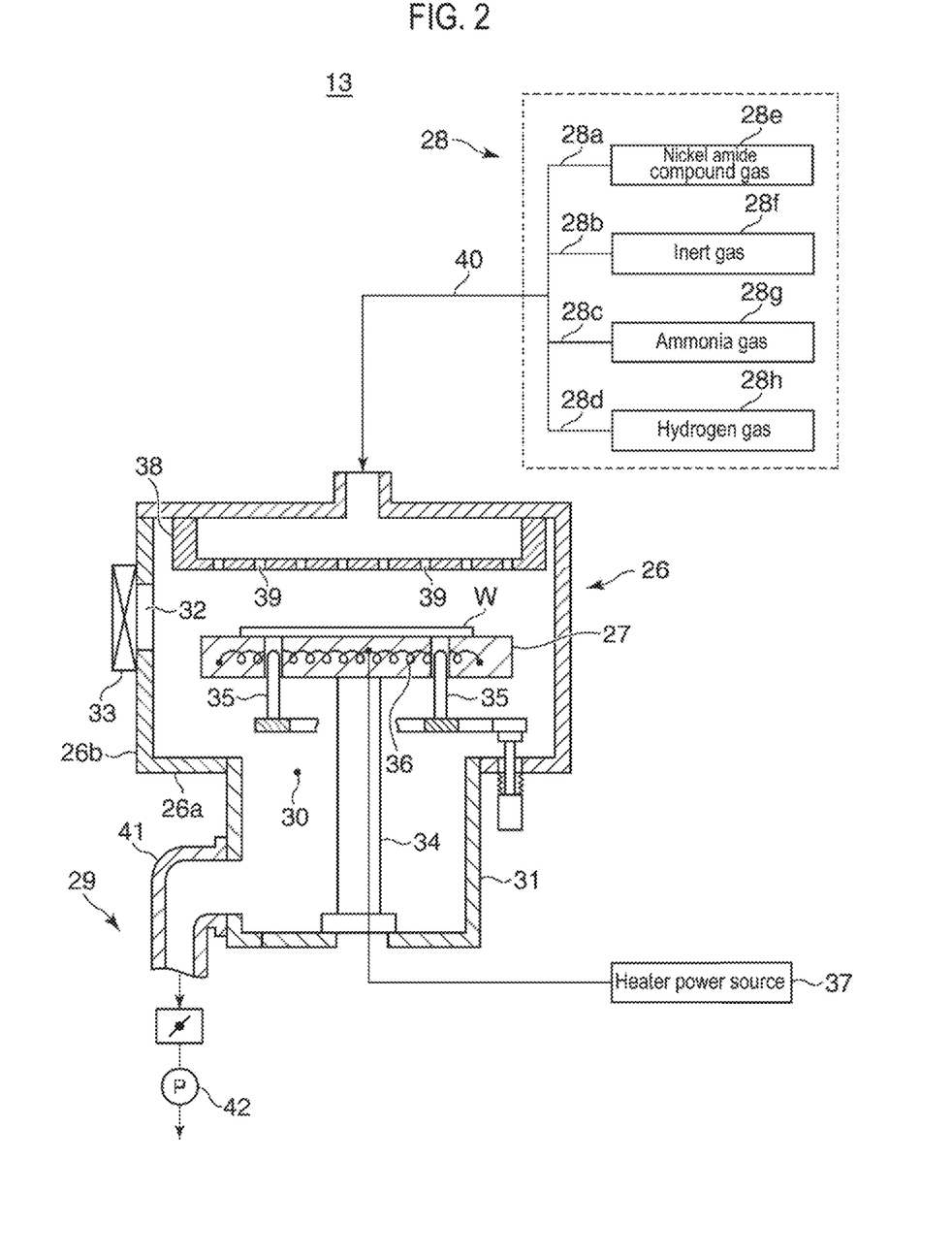
FIG. 2 is a cross-sectional view schematically illustrating a configuration of a base film formation module of FIG. 1.

FIG. 2 is a cross-sectional view schematically illustrating a configuration of the base film formation module 13 of FIG. 1.

In FIG. 2, the base film formation module 13 includes a substantially cylindrical process chamber 26 having an airtight structure, a loading table 27 which is installed within the process chamber 26 and loads the wafer W, a gas supply system 28 for supplying a gas into the process chamber 26, and an exhaust system 29 for evacuating the interior of the process chamber 26.

A circular opening 30 is formed in a substantially central portion of a bottom wall 26a of the process chamber 26. An exhaust chamber 31, which communicates with the interior of the process chamber 26 through the opening 30 and protrudes downwardly in the drawing, is installed in the bottom wall 26a. A carrying in/out hole 32 for carrying the wafer W to and from the process chamber 26 and a gate valve 33 for opening and closing the carrying in/out hole 32 are installed at a sidewall 26b of the process chamber 26.

The loading table 27 is formed of ceramics of, e.g., MN, and is supported by a cylindrical support pillar 34, which is formed of ceramics and extends upwardly from a bottom central portion of the exhaust chamber 31. Elevating pins 35 for elevating the wafer W is housed within the loading table 27, and the elevating pins 35 protrude from a surface of the loading table 27 to separate the wafer W from the loading table 27.

A resistance heating type heater 36 is embedded within the loading table 27, and a heater power source 37 is connected to the heater 36. The wafer W loaded on the loading table 27 is heated by supplying an electric current from the heater power source 37 to the heater 36. Further, a thermocouple (not shown) is inserted into the loading table 27 to measure a temperature of the wafer W, and the heater 36 controls the temperature of the wafer W within a range from 50 to 1000 degrees C. Also, in the following description, the temperature of the wafer W does not mean a set temperature of the heater 36 but means a temperature measured by the thermocouple unless specifically mentioned otherwise.

The gas supply system 28 has a shower plate 38 formed to uniformly jet a supplied gas into the process chamber 26. The shower plate 38 has a plurality of gas discharge holes 39 opened to face the loading table 27. The shower plate 38 is connected to the gas supply system 28 through a gas supply path 40. The gas supply system 28 has four branch paths 28a, 28b, 28c, and 28d branched from the gas supply path 40 connected to the shower plate 38. The branch path 28a is connected to a nickel amide compound gas supply source 28e for supplying a nickel amide compound gas as an organic metal compound gas. The branch path 28b is connected to an inert gas supply source 28f for supplying an inert gas. The branch path 28c is connected to an ammonia gas supply source 28g for supplying an ammonia gas as a reduction gas. The branch path 28d is connected to a hydrogen gas supply source 28h for supplying a hydrogen gas as a reduction gas. A mass flow controller (not shown) and a valve (not shown) are installed at the branch paths 28a, 28b, 28c, and 28d.

In the base film formation module 13, for example, a nickel alkylamidinate gas is used as the nickel amide compound gas, and an argon (Ar) gas or the like is used as the inert gas. The inert gas supplied from the inert gas supply source 28f is used as, e.g., a purge gas or a carrier gas. In the base film formation module 13, nickel alkylamidinate is supplied from the nickel amide compound gas supply source 28e in the form of being dissolved in an organic solvent, and thereafter, the nickel alkylamidinate gas, which is vaporized when the organic solvent passes through a vaporization unit (not shown), is supplied from the shower plate 38.

The exhaust system 29 has an exhaust pipe 41, which is opened on the side of the exhaust chamber 31, and a vacuum pump 42 connected to the exhaust pipe 41. The exhaust system 29 introduces an internal gas of the process chamber 26 into an internal space of the exhaust chamber 31, and also, exhausts the gas to the outside from the internal space through the exhaust pipe 41 by operating the vacuum pump 42. Accordingly, the interior of the process chamber 26 can be decompressed to, e.g., 666 Pa.

Figure 3:
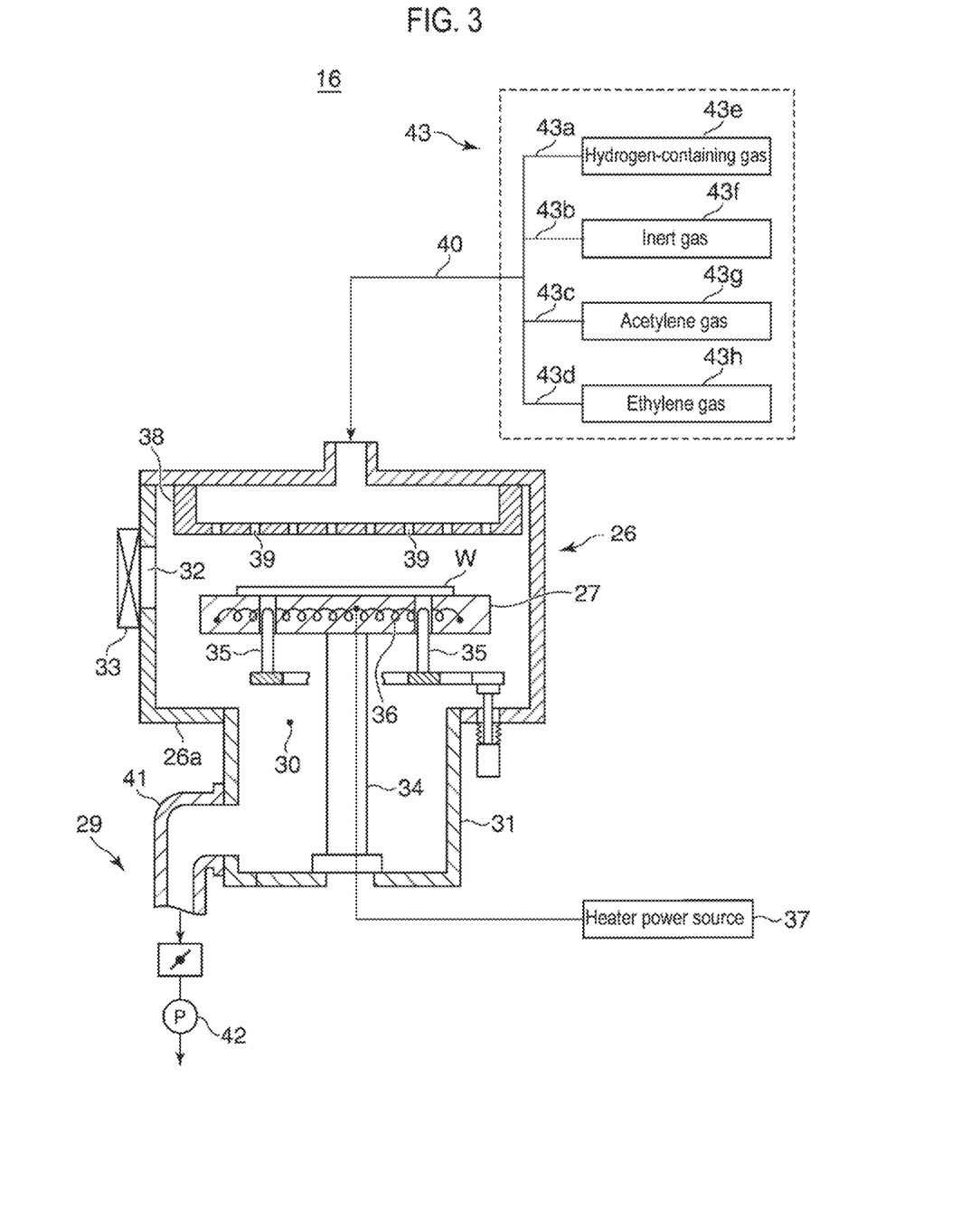
FIG. 3 is a cross-sectional view schematically illustrating a configuration of a graphene formation module of FIG. 1.

FIG. 3 is a cross-sectional view schematically illustrating a configuration of the graphene formation module 16 of FIG. 1. The configuration of the graphene formation module 16 is basically the same as that of the base film formation module 13 and only the types of gases supplied from the gas supply system are different. Thus, the only differences from the configuration of the base film formation module 13 will be described hereinafter.

In FIG. 3, the gas supply system 43 of the graphene formation module 16 has four branch paths 43a, 43b, 43c, and 43d branched from the gas supply path 40.

The branch path 43a is connected to a hydrogen-containing gas supply source 43e for supplying a hydrogen-containing gas. The branch path 43b is connected to an inert gas supply source 43f for supplying an inert gas. The branch path 43c is connected to an acetylene gas supply source 43g for supplying an acetylene gas as a carbon-containing gas. The branch path 43d is connected to an ethylene gas supply source 43h for supplying an ethylene gas as a carbon-containing gas. A mass flow controller (not shown) and a valve (not shown) are installed at the branch paths 43a, 43b, 43c, and 43d. Further, in the graphene formation module 16, for example, a hydrogen gas or an ammonia gas is used as a hydrogen-containing gas.

Since a surface state of the nickel film as the base film, in particular, smoothness significantly affects the quality of the formed graphene, the present inventors confirmed the influence of the heat treatment on the smoothness of the nickel film formed by MOCVD before the present disclosure was made.

Figure 4A:
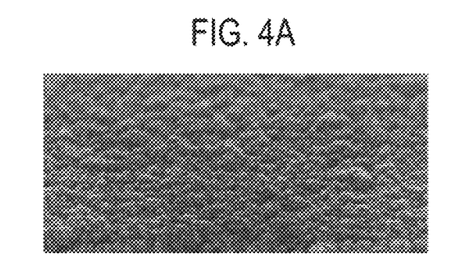
FIG. 4A is a scanning electron microscope (SEM) photograph of a surface of the nickel film in an as-deposited state formed by the MOCVD.

Specifically, first, a nickel film was formed on the wafer W by MOCVD using the nickel amide compound gas, the ammonia gas and the hydrogen gas, and the surface state of the nickel film was checked by an electron microscope (SEM). Consequently, it was confirmed that the surface of the nickel film was covered by a plurality of micro-irregularities as illustrated in FIG. 4A.

Figure 4B:
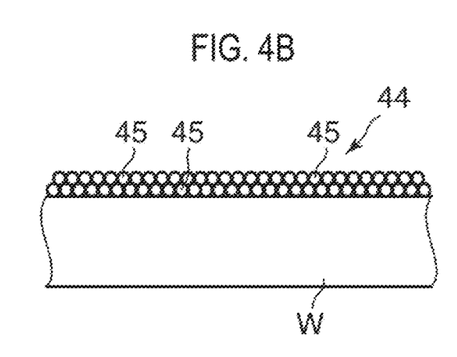
FIG. 4B is a cross-sectional view schematically illustrating a configuration of the nickel film of FIG. 4A.

The reason why the surface of the nickel film has the micro-irregularities was presumed as follows. As illustrated in FIG. 4B, particles having a small diameter of nickel are deposited on the wafer W in the MOCVD to form the nickel film. Thus, a state in which a plurality of small-diameter particles 45 of nickel independently exist in the nickel film 44 (as-deposited state) is maintained, and the small-diameter particles 45 of nickel also independently exist on the surface of the nickel film 44.

Figure 4C:
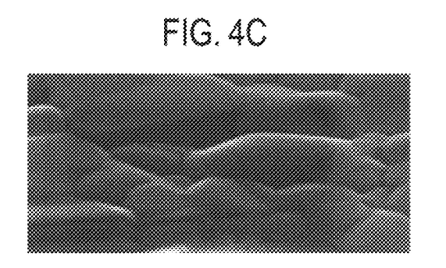
FIG. 4C is an SEM photograph of a surface of a nickel film on which a high temperature heat treatment was performed once.

Thus, in order to resolve the presence of the small-diameter particles 45 of nickel by amalgamating the small-diameter particles 45 of the nickel which independently exist, the present inventors performed the heat treatment only once on the nickel film 44 in an as-deposited state by heating the wafer W at a high temperature, e.g., at 650 degrees C. Consequently, it was confirmed that, as illustrated in FIG. 4C, the micro-irregularities became extinct from the surface of the nickel film 44 and a plurality of relatively large crystal grains of nickel were generated. Meanwhile, it was also confirmed that roughening occurred on the surface of the nickel film 44 due to expanded blisters including a gas or rapid thermal coagulation of the small-diameter particles 45 of nickel due to the provision of high thermal energy, resulting in that smoothness was not enhanced.

Figure 4D:
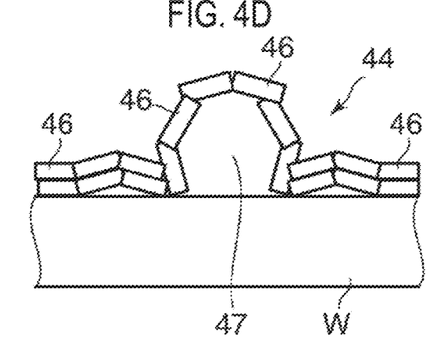
FIG. 4D is a cross-sectional view schematically illustrating a configuration of the nickel film of FIG. 4C.

The reason why the blisters existed on the surface of the nickel film 44 was presumed as follows. When the heat treatment of the relatively high temperature was performed on the nickel film 44, a plurality of nickel crystal grains 46 were generated as illustrated in FIG. 4D, and at the same time, impurities such as an organic substance included in the nickel film 44 were gasified. Thus, a gas 47 generated from the impurities was surrounded by the crystal grains 46 to remain in the nickel film 44.

Figure 4E:
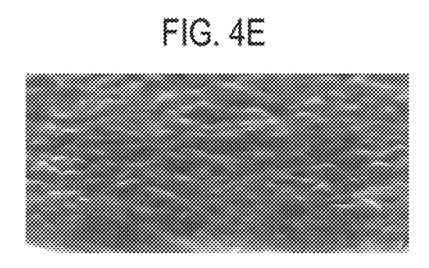
FIG. 4E is an SEM photograph of a surface of a nickel film on which a relatively low temperature heat treatment and the high temperature heat treatment were performed separately.

Thus, the present inventors performed a heat treatment on the nickel film 44 in an as-deposited state to heat the wafer W at a temperature of 300 degrees C., which is first relatively low and is higher than the temperature (250 degrees C.) of the wafer W heated in the MOCVD to form the nickel film 44, and subsequently performed a heat treatment to heat the wafer W at a higher temperature of 650 degrees C. Consequently, it was confirmed that, as illustrated in FIG. 4E, the micro-irregularities were no longer present on the surface of the nickel film 44 and the smoothness of the nickel film 44 was enhanced.

Figure 4F:
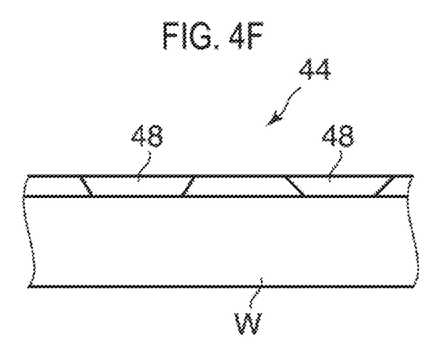
FIG. 4F is a cross-sectional view schematically illustrating a configuration of the nickel film of FIG. 4E.

The reason why the smoothness of the nickel film 44 was enhanced was presumed as follows. When the wafer W was first heated to 300 degrees C., impurities such as an organic substance included in the nickel film 44 were gasified, but high heat energy was not provided to the small-diameter particles 45 of nickel, so the small-diameter particles 45 of nickel were not positively amalgamated, making it difficult to generate a core (nucleus) initiating the growth of the crystal grains 46 of nickel. Thus, the crystal grains 46 were not generated and a gas generated from the impurities was eliminated from the nickel film 44, without being surrounded by the crystal grains 46, resultantly not generating blisters. Further, when a sufficient thermal energy was provided for the wafer W to be heated to 650 degrees C. so as to be amalgamated to the small-diameter particles 45 of nickel, since a small amount of cores were already formed, the small-diameter particles 45 of nickel were amalgamated in each core as a start point so as to be grown as a small number of large crystal grains 48 as illustrated in FIG. 4F.

From the above, it can be seen that, in order to enhance the smoothness of the nickel film, the heat treatment is first performed on the nickel film in an as-deposited state to heat the wafer W to 300 degrees C., and subsequently, the heat treatment (hereinafter, referred to as "second-step heat treatment") is performed to heat the wafer W to 650 degrees C.

In addition, the present inventors checked an influence of a flow rate of each gas in the MOCVD on smoothness of the nickel film formed by the MOCVD before the present invention was made.

Figure 5A:
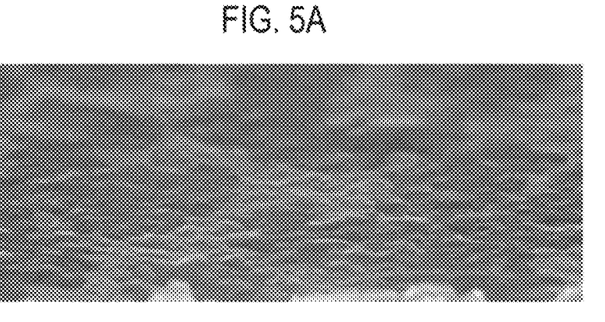
FIG. 5A is an SEM photograph of a surface of a nickel film when a flow rate of an ammonia gas was set to 70 sccm and a flow rate of a hydrogen gas was set to 280 sccm.

Specifically, first, in MOCVD using a nickel amide compound (e.g., nickelalkylamidinate), an ammonia gas, and a hydrogen gas, the present inventors set a flow rate of an organic solvent, e.g., tetralin, in which nickelalkylamidinate was dissolved to 750 mg/min., a flow rate of the ammonia gas to 70 sccm, and a flow rate of the hydrogen gas to 280 sccm to form a nickel film in an as-deposited state on a wafer W. Further, the two-step heat treatment was performed on the nickel film, a graphene was formed using the nickel film, and a surface state of the graphene was checked. Consequently, it was confirmed that, as illustrated in FIG. 5A, the surface of graphene was covered with a plurality of micro-irregularities, like the surface of the nickel film in the as-deposited state. Further, the surface state of the graphene was measured by a Raman spectroscopy to detect a Raman spectrum of dispersed light obtained from the surface of grapheme. Consequently, it was confirmed that a G/D ratio was 4.9, which is relatively low. The G/D ratio is an indicator indicating the quality of graphene, which is a ratio of a G band (a peak resulting from in-plane vibration of graphene) to a D band (a peak resulting from a defective structure of graphene) in the Raman spectrum, and as the G/D ratio is higher, the quality of graphene is better.

Figure 5B:
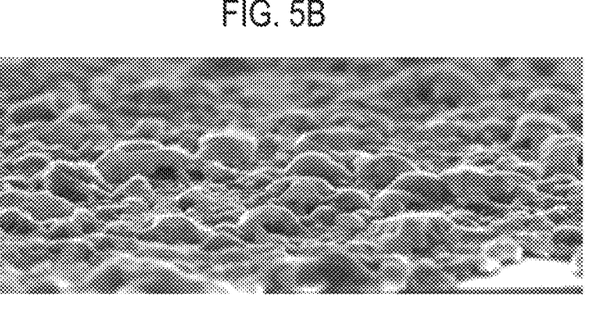
FIG. 5B is an SEM photograph of a surface of a nickel film when a flow rate of an ammonia gas was set to 350 sccm and a flow rate of a hydrogen gas was set to 0 sccm.

Subsequently, the present inventors formed a nickel film in an as-deposited state on a wafer W by setting a flow rate of tetralin with nickel alkylamidinate dissolved therein to 750 mg/min, setting a flow rate of an ammonia gas to 350 sccm, without supplying a hydrogen gas, in the MOCVD, and performed the two-step heat treatment on the nickel film, subsequently formed the graphene using the nickel film, and checked a surface state of the grapheme. Consequently, it was confirmed that the surface of the graphene had a porous shape as illustrated in FIG. 5B. Also, it was confirmed that the G/D ratio was 3.6, which is a low value, in the Raman spectrum obtained from the surface of the graphene.

Figure 5C:
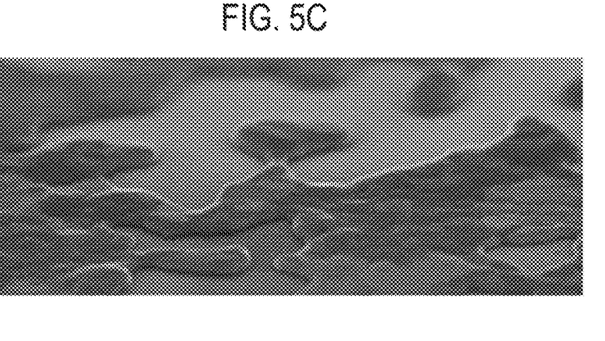
FIG. 5C is an SEM photograph of a surface of a nickel film when a flow rate of an ammonia gas was set to 175 sccm and a flow rate of a hydrogen gas was set to 175 sccm.

Subsequently, the present inventors formed a nickel film in an as-deposited state on the wafer W by setting a flow rate of tetralin with nickel alkylamidinate dissolved therein to 750 mg/min, setting a flow rate of an ammonia gas to 175 sccm, and setting a flow rate of a hydrogen gas to 175 sccm, in the MOCVD. Further the present inventors performed the two-step heat treatment on the nickel film, subsequently formed the graphene using the nickel film, and checked a surface state of the graphene. Consequently, it was confirmed that the surface of graphene was smooth as illustrated in FIG. 5C. Also, it was confirmed that the G/D ratio was 4.0, which is a relatively low value, in the Raman spectrum obtained from the surface of the graphene.

The reason why the surface of graphene was smooth was presumed as follows. Large crystal grains of nickel were easy to grow in the nickel film as the base film of the graphene due to the influence of the flow rates of the ammonia gas and the hydrogen gas. As a result, the smoothness of the nickel film was enhanced. Meanwhile, the reason why the G/D ratio of graphene formed by using the nickel film was low in spite of the enhancement of smoothness of the nickel film was presumed that the graphene was partially stripped as illustrated in FIG. 5C.

Further, as illustrated in FIG. 5C, the present inventors also confirmed that even the nickel film, as well as the graphene, was partially stripped to partially expose a silicon oxide ($SiO_2$) film as a base layer of the nickel film formed on the wafer W. The reason why the nickel film was partially stripped was presumed that the enhancement of smoothness of the nickel film was caused by degraded adhesion of the wafer W to the silicon oxide film.

From the above, it can be seen that, in order to enhance the smoothness of the nickel film, the flow rate of the ammonia gas in the MOCVD may be increased and, in particular, the flow rate of the ammonia gas and the flow rate of the hydrogen gas may be close to each other. In this case, however, it can also be seen that it is required to maintain supply of the hydrogen gas. Meanwhile, it can be seen that, in order to enhance adhesion between the nickel film and the silicon oxide film of the wafer W, the smoothness of the nickel film may be lowered by reducing the flow rate of the ammonia gas to be smaller than that of the hydrogen gas in the MOCVD.

The present disclosure is based on the recognition obtained as described above. Further, in this embodiment, the crystal grains have a shape of lump, grain, domain, or the like.

Subsequently, the wiring formation process in the graphene forming method according to this embodiment will be described. In this process, a graphene is formed as wiring on a wafer W. Also, this process is realized as the control unit 22 of the substrate processing system 10 executes a recipe corresponding to this process in the process controller 23.

Figure 6:
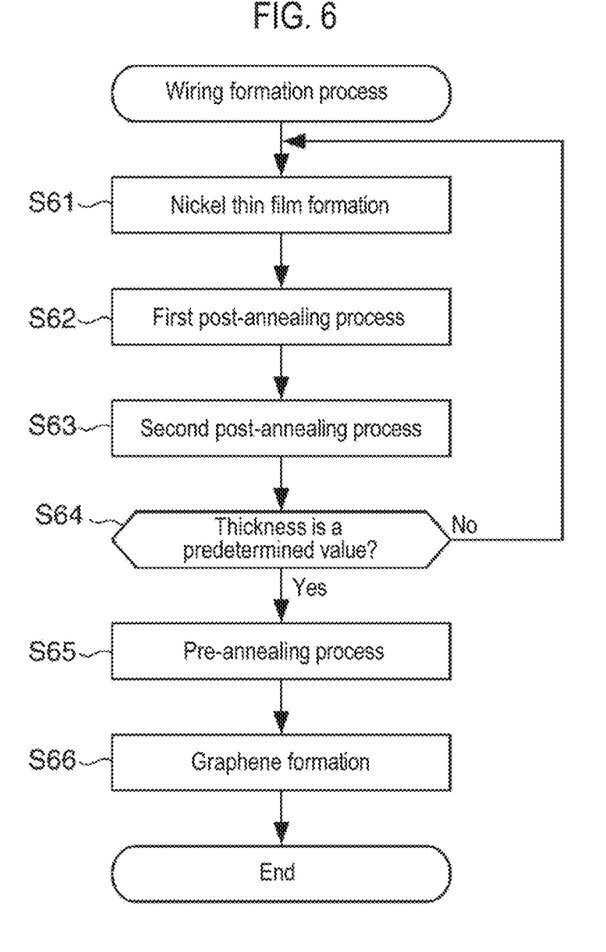
FIG. 6 is a flowchart illustrating a wiring formation process in a graphene forming method according to the present embodiment.

FIG. 6 is a flowchart illustrating the wiring formation process in the graphene forming method according to the present embodiment, and FIGS. 7A to 7D are views for describing the same wiring formation process.

First, a wafer W is transferred into the base film formation module 13 and is loaded on the loading table 27. Thereafter, the interior of the process chamber 26 is decompressed to 666 Pa by the exhaust system 29, and the nickel amide compound (organic metal compound), e.g., tetralin with the nickel alkylamidinate dissolved therein, the ammonia gas, the hydrogen gas and the argon gas are introduced into the process chamber 26 by the gas supply system 28. At this time, a flow rate of the tetralin is set to 750 mg/min., a flow rate of the ammonia gas is set to 70 sccm, a flow rate of the hydrogen gas is set to 280 sccm, and a flow rate of the argon gas is set to 500 sccm.

Figure 7A:
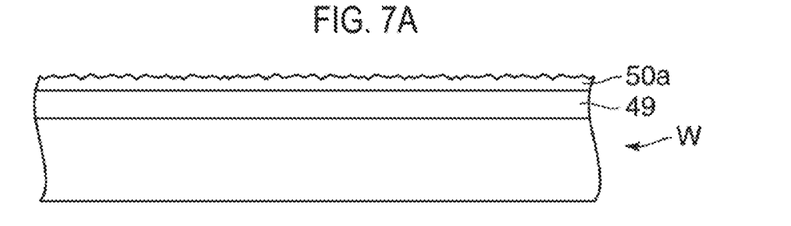
FIGS. 7A to 7D are views for describing the wiring formation process in the graphene forming method according to the present embodiment.
Figure 7B:
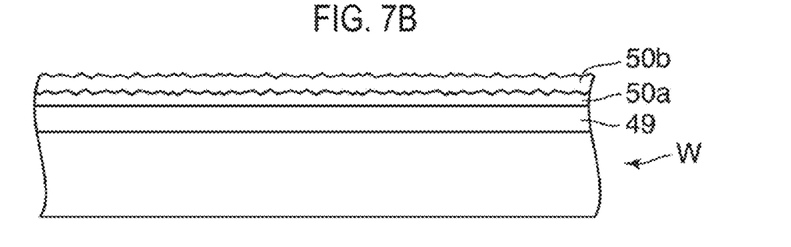

Subsequently, when the wafer W is heated to 250 degrees C. by the heater 36, a first nickel thin film 50a in an as-deposited state is formed on the silicon oxide film 49 as the base film of the wafer W by MOCVD (step S61, FIG. 7A). At this time, since the flow rate of the ammonia gas is lower than that of the hydrogen gas, the smoothness of the first nickel thin film 50a is lowered to enhance adhesion to the silicon oxide film 49.

Subsequently, the wafer W is transferred into the first heat treatment module 14, the interior of the first heat treatment module 14 is decompressed to 400 Pa and the wafer W is heated to 300 degrees C. by the heater. Thereafter, the temperature of the wafer W is maintained at 300 degrees C. for 10 minutes, and a first post-annealing process as the heat treatment is performed on the wafer W (first heating step) (step S62). At this time, the impurities such as the organic substance included in the first nickel thin film 50a in the as-deposited state are gasified to be eliminated. Further, in step S62, the argon gas having a flow rate of 1000 sccm as the carrier gas is introduced into the first heat treatment module 14, and a hydrogen gas having a flow rate of 1000 sccm is also introduced into the first heat treatment module 14 in terms of prevention of oxidation of the first nickel thin film 50a.

Subsequently, the wafer W is transferred into the second heat treatment module 15, the interior of the second heat treatment module 15 is decompressed to 400 Pa and the wafer W is heated to 650 degrees C. by the heater. Thereafter, the temperature of the wafer W is maintained at 650 degrees C. for 10 minutes, and a second post-annealing process as the heat processing is performed on the wafer W (second heating step) (step S63). At this time, a plurality of small-diameter particles of the nickel are amalgamated, starting from a small number of cores, to grow as a small number of crystal grains in the first nickel thin film 50a in the as-deposited state. Thus, the smoothness of the first nickel thin film 50a is enhanced. Further, in step S63, like step S62, the argon gas having a flow rate of 1000 sccm and the hydrogen gas having a flow rate of 1000 sccm are introduced into the second heat treatment module 15.

Subsequently, in step S64, it is determined whether a thickness of the first nickel thin film 50a has reached a predetermined value. If it is determined that the thickness of the first nickel thin film 50a has reached the predetermined value ("YES" in step S64), the process proceeds to step S65 to be described later. Otherwise, if it is determined that the thickness of the first nickel thin film 50a has not reached the predetermined value ("NO" in step S64), the process is returned to step S61.

Further, in this process, when it is determined as "NO" in step S64, the process is returned to step S61. Therefore, formation of the nickel thin film is repeated and each of the stacked nickel thin films forms a nickel film. In this embodiment, when the formation of the nickel thin film is repeated three times to form the nickel film including three-layer nickel thin films, it is determined that the thickness of the nickel film has reached the predetermined value.

Subsequently, when the process is returned to step S61, step S61 is executed under the same conditions as those of step S61 for the first time to stack a second nickel thin film 50b in an as-deposited state on the first nickel thin film 50a (FIG. 7B), step S62 is executed under the same conditions as those of step S62 for the first time to perform the first post-annealing process on the wafer W, and step S63 is executed under the same conditions as those of step S63 for the first time to perform the second post-annealing process on the wafer W. Also, in this case, the smoothness of the second nickel thin film 50b formed in step S61 is so low that the adhesion to the first nickel thin film 50a is enhanced, the impurities such as the organic substance included in the second nickel thin film 50b in the as-deposited state is gasified to be eliminated by the first post-annealing process, and the smoothness of the second nickel thin film 50b is enhanced by the second post-annealing process.

Subsequently, in step S64, it is determined whether a stacked thickness of the first nickel thin film 50a and the second nickel thin film 50b has reached the predetermined value. In this embodiment, since it is determined that the stacked thickness of the first nickel thin film 50a and the second nickel thin film 50b has not yet reached the predetermined value ("NO" in step S64), the process is returned to step S61.

Figure 7C:
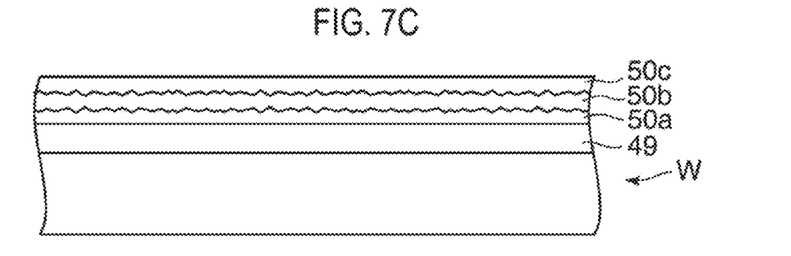

Subsequently, when the process is returned to step S61, step S61 is executed under the same conditions as those of step S61 for the first time, except that the flow rate of the ammonia gas is set to 175 sccm and the flow rate of the hydrogen gas is set to 175 sccm. Thus, a third nickel thin film 50c is stacked on the second nickel thin film 50b (FIG. 7C). At this time, since the flow rate of the ammonia gas is increased to be equal to that of the hydrogen gas, the smoothness of the third nickel thin film 50c is enhanced.

Subsequently, step S62 is executed under the same conditions as those of step S62 for the first time to perform the first post-annealing process on the wafer W, and step S63 is executed under the same conditions as those of step S63 for the first time to perform the second post-annealing process on the wafer W. Also, at this time, the impurities such as the organic substance included in the third nickel thin film 50c is gasified to be eliminated by the first post-annealing process, and the smoothness of the third nickel thin film 50c is further enhanced by the second post-annealing process.

Subsequently, in step S64, it is determined whether the thickness of the nickel film 50 (metal film, base film) including the first nickel thin film 50a, the second nickel thin film 50b and the third nickel thin film 50c has reached the predetermined value. In this embodiment, since it is determined that the thickness of the nickel film 50 (metal film, base film) including the first nickel thin film 50a, the second nickel thin film 50b and the third nickel thin film 50c has reached the predetermined value ("YES" in step S64), the process proceeds to step S65. Further, in this embodiment, since the third nickel thin film 50c is positioned at the uppermost portion of the nickel film 50, a surface of the nickel film 50 is substantially formed by the third nickel thin film 50c.

Subsequently, the wafer W is transferred into the graphene formation module 16 and is loaded on the loading table 27. Thereafter, the interior of the process chamber 26 is decompressed to 140 Pa by the exhaust system 29, and the hydrogen gas and the argon gas are introduced into the process chamber 26 by the gas supply system 43. At this time, the flow rate of the hydrogen gas is set to 1000 sccm, and the flow rate of the argon gas is set to 1000 sccm.

Subsequently, the wafer W is heated to 500 degrees C. by the heater. Thereafter, the temperature of the wafer W is maintained at 500 degrees C. for more than 5 minutes to perform a pre-annealing process as the heat treatment on the wafer W (step S65). At this time, the surface of the nickel film 50 is reduced by the hydrogen gas so as to be activated.

Subsequently, an internal pressure of the process chamber 26 is set to 400 Pa by the exhaust system 29, and the acetylene gas and the argon gas are introduced to the interior of the process chamber 26 by the gas supply system 43. The flow rate of the acetylene gas is set to 5 sccm, and the flow rate of the argon gas is set to 2200 sccm. At this time, the acetylene gas introduced to the interior of the process chamber 26 is thermally decomposed to generate carbon atoms, and the carbon atoms are solved in the activated nickel film 50.

Figure 7D:
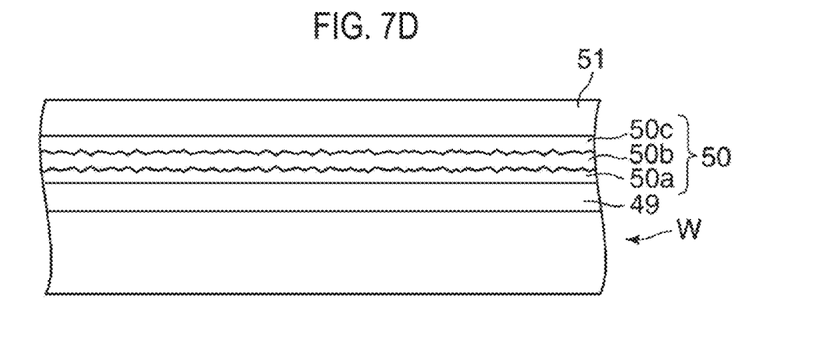

Subsequently, when the internal pressure of the process chamber 26 is set to 0 Pa by the exhaust system 29 and the interior of the process chamber 26 is vacuumized, the carbon atoms solved in the nickel film 50 are saturated to precipitate carbon crystals and generate a graphene 51 as the wiring film on the nickel film 50 (graphene formation step) (step S66, FIG. 7D). Thereafter, this process is terminated.

According to the wiring formation process of FIG. 6, the first post-annealing process in which the wafer W is heated to 300 degrees C. as a temperature that the impurities included in the first nickel thin film 50a, the second nickel thin film 50b and the third nickel thin film 50c formed by the MOCVD are eliminated as a gas is executed, and thereafter, the second post-annealing process in which the wafer W is heated to 650 degrees C. as a temperature that the crystal grains of the nickel are grown in the first nickel thin film 50a, the second nickel thin film 50b and the third nickel thin film 50c is executed. In particular, since the formation of the nickel thin films, the first post-annealing process and the second post-annealing process are repeated in this order, a gas of the impurities can be prevented from being confined by the crystal grains of the nickel in each of the stacked first nickel thin film 50a, second nickel thin film 50b and third nickel thin film 50c. As a result, generation of blisters can be prevented, and in addition, the smoothness of the first nickel thin film 50a, the second nickel thin film 50b and the third nickel thin film 50c, and further, the smoothness of the nickel film 50 can be improved. Accordingly, a high quality graphene 51 can be formed by using the nickel film 50.

Further, in the wiring formation process of FIG. 6 described above, in the formation of the first nickel thin film 50a which is in contact with the silicon oxide film 49 of the wafer W, since the flow rate of the ammonia gas is set to be lower than that of the hydrogen gas, the smoothness of the first nickel thin film 50a is lowered to enhance adhesion to the silicon oxide film 49, while in the formation of the third nickel thin film 50c which forms the surface of the nickel film 50, since the flow rate of the ammonia gas is increased to be equal to the flow rate of the hydrogen gas, the smoothness of the third nickel thin film 50c is enhanced. Accordingly, the adhesion of the nickel film 50 to the silicon oxide film 49 of the wafer W is secured, thereby preventing the nickel film 50 and the graphene 51 from being stripped from the wafer W and also realizing a high quality of the graphene 51 formed by using the nickel film 50.

Figure 8A:
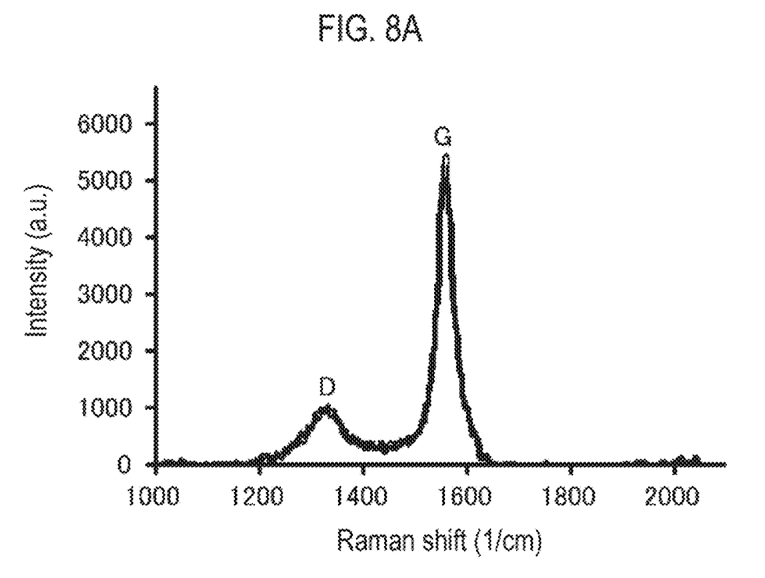
FIG. 8A shows a case in which a flow rate of an ammonia gas and a flow rate of a hydrogen gas are not changed in step S61 when steps S61 to S63 were repeated.
Figure 8B:
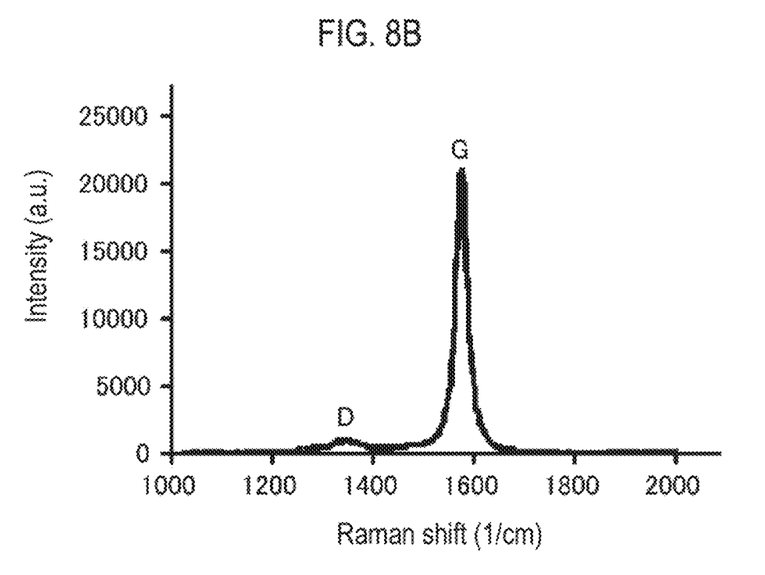
FIG. 8B shows a case in which a ratio of a flow rate of an ammonia gas to a flow rate of a hydrogen gas is increased in a final step S61 when steps S61 to S63 are repeated.

FIGS. 8A and 8B are graphs illustrating a Raman spectrum obtained from the surface of the graphene which is formed by using the nickel film obtained by repeating steps S61 to S63 of FIG. 6 three times. FIG. 8A shows a case in which the flow rate of the ammonia gas and the flow rate of the hydrogen gas are not changed in step S61 when steps S61 to S63 are repeated, and FIG. 8B shows a case in which a ratio of the flow rate of the ammonia gas to the flow rate of the hydrogen gas was increased in a final step S61 when steps S61 to S63 are repeated.

In step S61 executed for the third time, when the flow rate of the ammonia gas was maintained at 70 sccm and the flow rate of the hydrogen gas was maintained at 280 sccm, the G band of the Raman spectrum obtained from the surface of the graphene 51 was relatively reduced, as illustrated in FIG. 8A, and thus, the G/D ratio was 5.5, which is a relatively small value.

Meanwhile, in step S61 for the first time and the second time, the flow rate of the ammonia gas was set to 70 sccm and the flow rate of the hydrogen gas was set to 280 sccm. Thereafter, when the flow rate of the ammonia gas was set to 175 sccm and the flow rate of the hydrogen gas was set to 175 sccm in step S61 for the third time, the G band of the Raman spectrum obtained from the surface of the graphene 51 was increased to result in that the G/D ratio had a very high value of 21.0, as illustrated in FIG. 8B. That is, when the ratio of the flow rate of the ammonia gas to the flow rate of the hydrogen gas was increased in the final step S61, the quality of the formed graphene 51 was significantly enhanced. Thus, it can be seen that the enhancement of quality of the graphene 51 is significantly affected when the smoothness of the nickel thin film is enhanced by increasing the ratio of the flow rate of the ammonia gas to the flow rate of the hydrogen gas in forming the nickel thin film of the uppermost portion forming the surface of the nickel film 50. As a result, in the case in which the nickel film is obtained from the nickel thin films stacked by repeatedly forming the nickel thin films, it can be seen that increasing the ratio of the flow rate of the ammonia gas to the flow rate of the hydrogen gas in forming at least the uppermost nickel thin film is effective to form the high quality graphene 51.

While the present disclosure has been described above using the foregoing embodiment, the present disclosure may not be limited to the foregoing embodiment.

For example, in this embodiment, the nickel film 50 is formed as the base film of the graphene 51. However, a metal used to form the base film (catalytic metal layer) of the graphene is not limited to the nickel. For example, the base film of the graphene 51 may be formed of iron (Fe) or cobalt (Co). Also, in this case, the base film formed of the iron or the cobalt can be obtained by the wiring formation process of FIG. 6.

Further, in the wiring formation process of FIG. 6, the wafer W is heated to 300 degrees C. in the first post-annealing process. However, the temperature of the wafer W in the first post-annealing process is not limited to 300 degrees C. and any temperature may be employed so long as the impurities included in the nickel thin films may be gasified to be eliminated and the crystal grains of the nickel are not grown in the nickel thin films. In addition, the wafer W is heated to 650 degrees C. in the second post-annealing process. However, the temperature of the wafer W is not limited to 650 degrees C. in the second post-annealing process and any temperature may be employed so long as the crystal grains of the nickel may be grown in the nickel thin films.

Further, in the wiring formation processing of FIG. 6, the flow rate of the ammonia gas is set to 70 sccm and the flow rate of the hydrogen gas is set to 280 sccm in step S61 for the first time and the second time. However, the flow rate of the ammonia gas and the flow rate of the hydrogen gas are not limited thereto and at least the flow rate of the hydrogen gas may be set to be greater than the flow rate of the ammonia gas. Also, in this case, the nickel thin film having good adhesion to the silicon oxide film 49 can be formed. Further, the flow rate of the ammonia gas is set to 175 sccm and the flow rate of the hydrogen gas is set to 175 sccm in step S61 for the third time. However, the flow rate of the ammonia gas and the flow rate of the hydrogen gas may not need to be equal, and the flow rate of the ammonia gas and the flow rate of the hydrogen gas may need to be almost the same. Also, in this case, the nickel thin film having good smoothness can be obtained.

Further, in the wiring formation process of FIG. 6, step S61 to step S63 are repeated three times. However, the number of times step S61 to step S63 are repeated is not limited to three times. In this case, the ratio of the flow rate of the ammonia gas to the flow rate of the hydrogen gas may be increased in the final step S61. Accordingly, the smoothness of the uppermost nickel thin film, which constitutes the nickel film 50, can be enhanced. Further, in a case in which the surface layer of the wafer W is formed of a film having good adhesion to the nickel thin film, rather than the silicon oxide film 49, since there is no need to enhance adhesion to the surface layer of the wafer W in the nickel film 50, the formation of nickel thin films may not be repeated and step S61 to step 63 may be executed only once to form a nickel film. Also, in this case, the ratio of the flow rate of the ammonia gas to the flow rate of the hydrogen gas may be increased.

Further, in the wiring formation process of FIG. 6, after each of the nickel thin films is formed, the heat treatment (first post-annealing process and second post-annealing process) is performed twice on the nickel thin films. However, the number of times the heat treatment is repeated, which is performed after the formation of each nickel thin film, is not limited to twice and it may be three times or greater. In this case, the temperature of the wafer W may be increased, which is heated as the heat processing is repeated.

Further, in the wiring formation process of FIG. 6, when the heat processing is performed on each nickel thin film twice, the temperature of the wafer W is controlled stepwise such that the temperature is first maintained at 300 degrees C. and next maintained at 650 degrees C. However, it is not necessary to increase the temperature of the wafer W stepwise, and the temperature of the wafer W may be gradually changed within a temperature range in which the impurities included in the nickel thin films are first gasified to be eliminated and the crystal grains of the nickel are not grown in the nickel thin films, and thereafter, the temperature of the wafer W may be gradually changed within a temperature range in which crystal grains may be grown in the nickel thin films.

In addition, in the wiring formation processing of FIG. 6, there is no need to execute step S61 to step S63 each time when the formation of the nickel thin films is repeated, and for example, step S63 for the first time and second time may be skipped. Also, in this case, since step S62 for the first time and second time is executed, the impurities of each of the nickel thin films are gasified to be eliminated, removing a possibility of generation of blisters in the nickel film 50.

According to the embodiments of the present disclosure, since the substrate is heated to a temperature at which the impurities included in the metal film formed by CVD of the organic metal compound are eliminated as a gas, and thereafter, the substrate is heated to a temperature at which crystal grains of metal are grown in the metal film, the gas of impurities can be prevented from being confined in the metal film according to the growth of crystal grains, and in addition, the smoothness of the metal film as the base film of the graphene can be improved. As a result, a high quality graphene can be formed by using the metal film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A graphene forming method, comprising:
   forming a metal film as a base film of a graphene on a substrate; and
   forming the graphene on the metal film,
   wherein the forming a metal film comprises:
   forming the metal film on the substrate by CVD of an organic metal compound using a hydrogen gas and an ammonia gas;
   heating the substrate to a first temperature at which impurities included in the formed metal film are eliminated as a gas; and
   heating the heated substrate to a second temperature higher than the first temperature at which crystal grains of metal are grown in the metal film.

2. The method of claim 1, wherein, in the forming the metal film on the substrate by CVD of an organic metal compound, the heating the substrate to a first temperature at which impurities included in the formed metal film are eliminated as a gas, and the heating the substrate to a second temperature higher than the first temperature at which crystal grains of metal are grown in the metal film are repeatedly executed in this order.

3. The method of claim 2, wherein, in the forming a metal film, a ratio of a flow rate of the ammonia gas to a flow rate of the hydrogen gas is changed when the forming the metal film is repeated.

4. The method of claim 3, wherein, in the forming a metal film, the ratio of the flow rate of the ammonia gas to the flow rate of the hydrogen gas is increased when forming the metal film is repeated.

* * * * *